(12) United States Patent
Van Schoot et al.

(10) Patent No.: US 10,558,126 B2
(45) Date of Patent: Feb. 11, 2020

(54) LITHOGRAPHIC APPARATUS AND METHOD

(71) Applicants: ASML Netherlands B.V., Veldhoven (NL); Carl Zeiss SMT GmbH, Oberkochen (DE)

(72) Inventors: Jan Bernard Plechelmus Van Schoot, Eindhoven (NL); Sascha Migura, Aalen-Unterrombach (DE); Bernhard Kneer, Altheim (DE)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 15/120,093

(22) PCT Filed: Feb. 10, 2015

(86) PCT No.: PCT/EP2015/052673
§ 371 (c)(1),
(2) Date: Aug. 18, 2016

(87) PCT Pub. No.: WO2015/124457
PCT Pub. Date: Aug. 27, 2015

(65) Prior Publication Data
US 2017/0176868 A1    Jun. 22, 2017

(30) Foreign Application Priority Data
Feb. 24, 2014   (EP) .................................... 14156365

(51) Int. Cl.
*G03F 7/20*   (2006.01)
*G03F 1/00*   (2012.01)

(52) U.S. Cl.
CPC ............ *G03F 7/70358* (2013.01); *G03F 1/00* (2013.01); *G03F 7/70033* (2013.01); *G03F 7/70233* (2013.01); *G03F 7/70433* (2013.01)

(58) Field of Classification Search
CPC ............ G03F 7/70033; G03F 7/70233; G03F 7/70358
See application file for complete search history.

(56) References Cited

U.S. PATENT DOCUMENTS

| 7,920,338 B2 * | 4/2011 | Ulrich ................ G02B 17/0812 359/364 |
| 2004/0009295 A1 * | 1/2004 | Kobayashi .............. G03F 7/091 427/240 |

(Continued)

FOREIGN PATENT DOCUMENTS

| JP | 2004031808 | 1/2004 |
| JP | 2004214242 | 7/2004 |

(Continued)

OTHER PUBLICATIONS

International Search Report and Written Opinion dated May 28, 2015 in corresponding International Patent Application No. PCT/EP2015/052673.

(Continued)

*Primary Examiner* — Steven Whitesell Gordon
(74) *Attorney, Agent, or Firm* — Pillsbury Winthrop Shaw Pittman LLP

(57) ABSTRACT

A lithographic apparatus including a support structure constructed to support a mask having a patterned area which is capable of imparting an EUV radiation beam with a pattern in its cross-section to form a patterned radiation beam, wherein the support structure is movable in a scanning direction, a substrate table constructed to hold a substrate, wherein the substrate table is movable in the scanning direction, and a projection system configured to project the patterned radiation beam onto an exposure region of the substrate, wherein the projection system has a demagnification in the scanning direction which is greater than a demagnification in a second direction which is perpendicular (Continued)

to the scanning direction and wherein the demagnification in the second direction is greater than 4×.

28 Claims, 4 Drawing Sheets

(56) References Cited

U.S. PATENT DOCUMENTS

| | | | |
|---|---|---|---|
| 2006/0068300 A1 | 3/2006 | Tanabe et al. | |
| 2009/0122290 A1* | 5/2009 | Van Dam | G03F 7/70358 355/67 |
| 2010/0103394 A1 | 4/2010 | Terasawa | |
| 2011/0141446 A1 | 6/2011 | Walser et al. | |
| 2011/0217634 A1* | 9/2011 | Shoki | G03F 1/24 430/5 |
| 2012/0327382 A1* | 12/2012 | Geh | G03F 7/703 355/52 |
| 2013/0128251 A1* | 5/2013 | Mann | G02B 13/08 355/67 |
| 2014/0377692 A1* | 12/2014 | Patra | G03F 7/70475 430/5 |
| 2016/0085061 A1* | 3/2016 | Schwab | G03F 7/70233 355/67 |

FOREIGN PATENT DOCUMENTS

| | | |
|---|---|---|
| JP | 2006126816 | 5/2006 |
| JP | 2008176326 | 7/2008 |
| JP | 2009124139 | 6/2009 |
| JP | 2013050716 | 3/2013 |
| JP | 2013541729 | 11/2013 |
| WO | 2013045597 | 4/2013 |

OTHER PUBLICATIONS

Taiwanese Office Action issued in corresponding Taiwanese Patent Application No. 104105709, dated Nov. 13, 2018.
Japanese Office Action issued in corresponding Japanese Patent Application No. 2016-545280, dated Jan. 10, 2019.

* cited by examiner

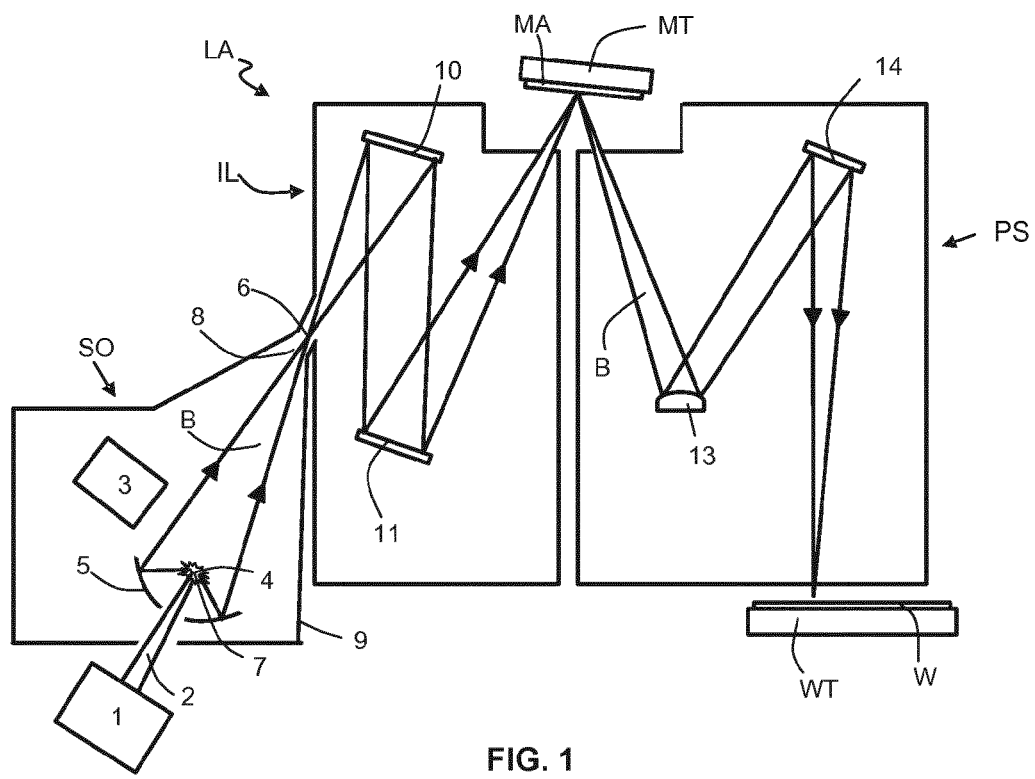
FIG. 1
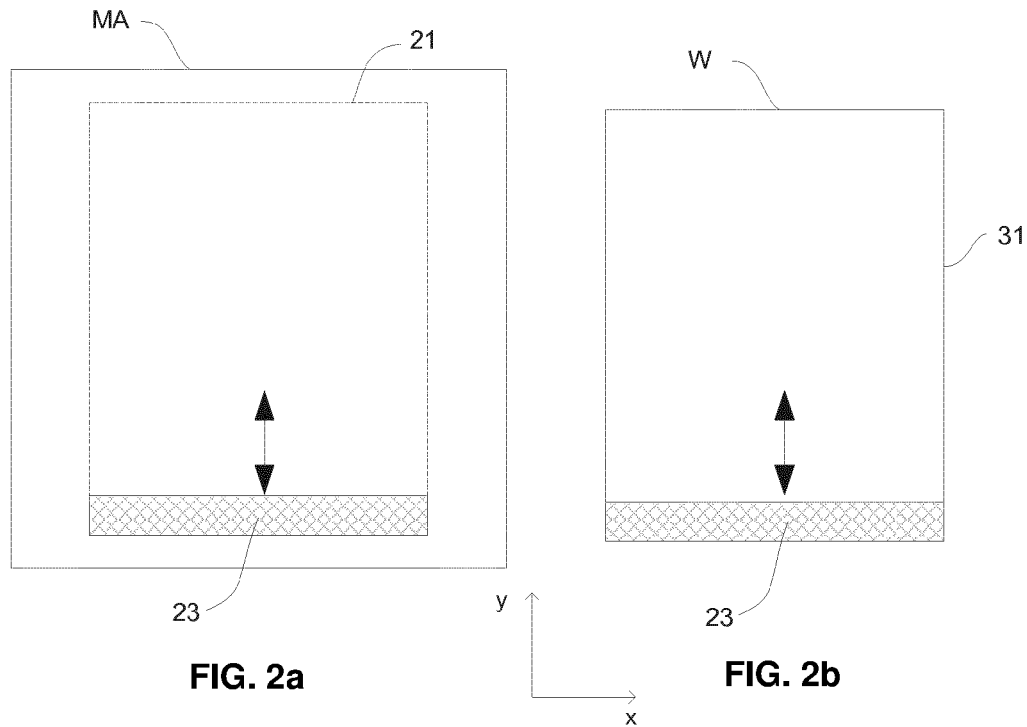
FIG. 2a  FIG. 2b

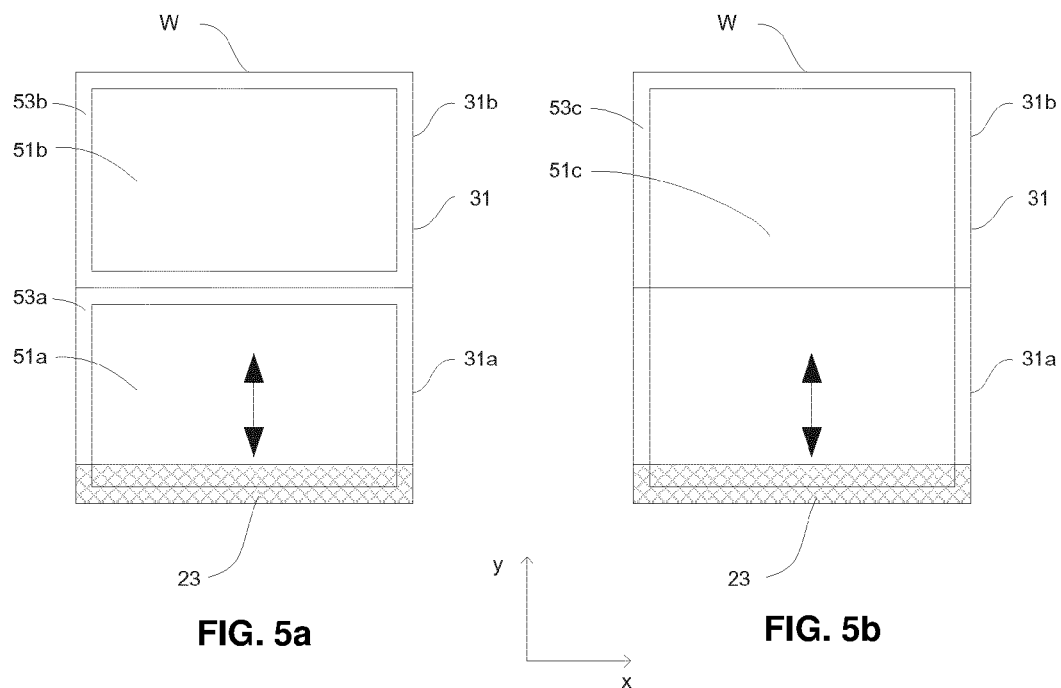
FIG. 5a
FIG. 5b
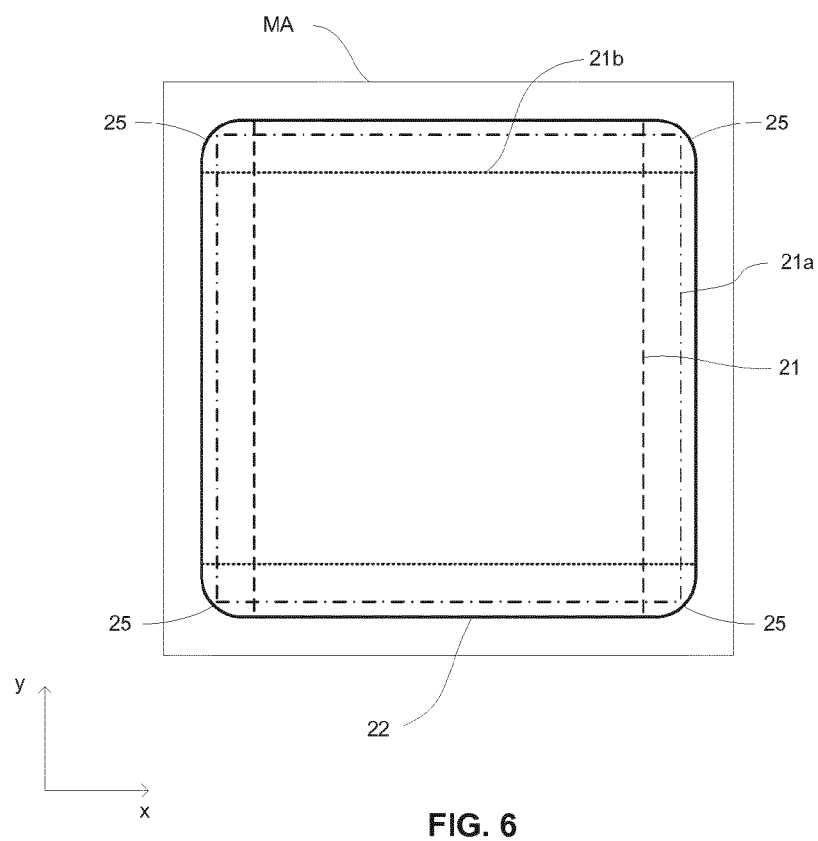
FIG. 6

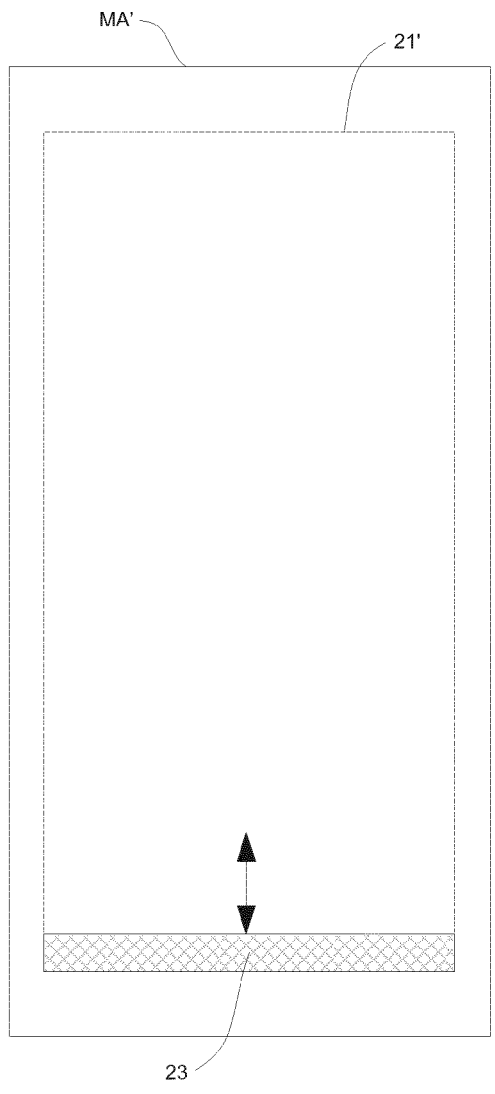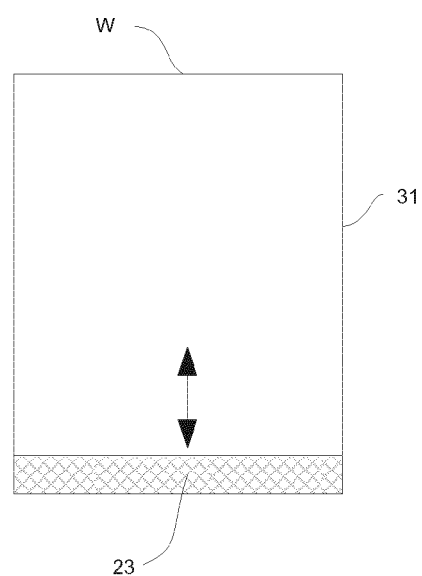
FIG. 7a  FIG. 7b

LITHOGRAPHIC APPARATUS AND METHOD

CROSS-REFERENCE TO RELATED APPLICATIONS

This application is the U.S. national phase entry of PCT patent application no. PCT/EP2015/052673, which was filed on Feb. 10, 2015, which claims the benefit of priority of EP patent application no. 14156365.0, which was filed on Feb. 24, 2014, and which is incorporated herein in its entirety by reference.

FIELD

The present invention relates to a method of exposing a substrate to a patterned radiation beam and a lithographic apparatus suitable for carrying out the method.

BACKGROUND

A lithographic apparatus is a machine constructed to apply a desired pattern onto a substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned.

Lithography is widely recognized as one of the key steps in the manufacture of ICs and other devices and/or structures. However, as the dimensions of features made using lithography become smaller, lithography is becoming a more critical factor for enabling miniature IC or other devices and/or structures to be manufactured.

A theoretical estimate of the limits of pattern printing can be given by the Rayleigh criterion for resolution as shown in equation (1):

$$CD = k_1 * \frac{\lambda}{NA} \quad (1)$$

where $\lambda$ is the wavelength of the radiation used, NA is the numerical aperture of the projection system used to print the pattern, k1 is a process dependent adjustment factor, also called the Rayleigh constant, and CD is the feature size (or critical dimension) of the printed feature. It follows from equation (1) that reduction of the minimum printable size (critical dimension) of features can be obtained in three ways: by shortening the exposure wavelength $\lambda$, by increasing the numerical aperture NA or by decreasing the value of k1.

In order to shorten the exposure wavelength $\lambda$ and, thus, reduce the critical dimension (CD), an extreme ultraviolet (EUV) radiation source may be used. EUV radiation may be considered to be radiation having a wavelength within the range 4-20 nm. A lithographic apparatus which uses EUV radiation, may be used to form smaller features on a substrate than a lithographic apparatus which uses radiation of a longer wavelength (e.g. a wavelength of approximately 193 nm).

It is desirable to provide a method of exposing a substrate to a patterned radiation beam which obviates or mitigates one or more problems associated with known lithographic methods

SUMMARY

According to a first aspect of the invention there is provided a lithographic apparatus comprising a support structure constructed to support a mask comprising a patterned area which is capable of imparting a radiation beam with a pattern in its cross-section to form a patterned radiation beam, wherein the support structure is movable in a scanning direction, a substrate table constructed to hold a substrate, wherein the substrate table is movable in the scanning direction, and a projection system configured to project the patterned radiation beam onto an exposure region of the substrate, wherein the projection system has a demagnification in the scanning direction which is greater than a demagnification in a second direction which is perpendicular to the scanning direction and wherein the demagnification in the second direction is greater than 4×.

The radiation beam may be an EUV radiation beam.

The demagnification of the projection system in the second direction may be greater than 4.5×.

The demagnification of the projection system in the second direction may be around 4.8×.

The demagnification of the projection system in the scanning direction may be greater than 6×.

The demagnification of the projection system in the scanning direction may be around 7.5×.

The patterned area of the mask may have an extent in the second direction which is greater than 104 mm.

The demagnification of the projection system in the second direction may be configured to expose an exposure region on the substrate which has an extent in the second direction of around 26 mm.

The patterned area of the mask may have an extent in the scanning direction which is less than or equal to 132 mm.

The demagnification of the projection system in the scanning direction may be configured to expose an exposure region on the substrate which has an extent in the scanning direction of around 16.5 mm.

The support structure may be constructed to support a mask having an extent in the scanning direction of about 6 inches The support structure may be constructed to support a mask having an extent in the second direction of about 6 inches.

According to a second aspect of the invention there is provided a method of exposing an exposure region on a substrate using a lithographic apparatus, the method comprising scanning an exposure slit of radiation in a scanning direction and over a patterned area of a mask, and projecting an exposure slit of radiation which is reflected from the mask onto the exposure region of the substrate with a demagnification in the scanning direction which is greater than a demagnification in a second direction which is perpendicular to the scanning direction, wherein the demagnification in the second direction is greater than 4×.

The radiation may be EUV beam.

The demagnification in the second direction may be greater than 4.5× and specifically around 4.8× 5× or 5.1×.

The demagnification in the scanning direction may be greater than 6× and specifically around 6.3×, 7×, 7.5× or 7.9×.

The patterned area of the mask may have an extent in the second direction which is greater than 104 mm.

The demagnification in the second direction and the extent of the patterned area in the second direction may be such that the exposure region on the substrate has an extent in the second direction of around 26 mm.

The patterned area of the mask may have an extent in the scanning direction which is less than or equal to 132 mm.

The demagnification in the second direction and the extent of the patterned area in the second direction may be such that the exposure region on the substrate has an extent in the second direction of around 16.5 mm.

The mask may have an extent in the scanning direction of about 6 inches.

The mask may have an extent in the second direction of about 6 inches.

The patterned area of the mask may be disposed on a quality area of the mask.

The quality area of the mask may have an extent in the scanning direction of approximately 132 mm.

The quality area of the mask may have an extent in the second direction of approximately 132 mm.

The quality area of the mask may have rounded corners.

The rounded corners may each have a radius of approximately 14 mm.

According to a third aspect of the invention there is provided a mask for use in a lithographic apparatus wherein the mask comprises a patterned area which is capable of imparting a radiation beam with a pattern in its cross-section to form a patterned radiation beam and wherein the mask is configured with a scanning direction in which the radiation beam is scanned over the patterned area in use, and wherein the patterned area has an extent of greater than 104 mm in a second direction which is perpendicular to the scanning direction.

The radiation beam may be an EUV radiation beam.

The patterned area may be disposed on a quality area of the mask.

The patterned area of the mask may have an extent in the second direction of approximately 124 mm.

The patterned area of the mask may have an extent in the scanning direction of approximately 124 mm.

The patterned area of the mask may have an extent in the second direction of approximately 132 mm.

The quality area of the mask may have rounded corners.

The rounded corners may each have a radius of approximately 14 mm.

The mask may have an extent in the scanning direction of around 6 inches.

The mask may have an extent in the second direction of around 6 inches.

According to a fourth aspect of the invention there is provided a method of exposing an exposure region on a substrate using a lithographic apparatus, the method comprising scanning an exposure slit of radiation in a scanning direction and over a patterned area of a mask, wherein the patterned area of the mask has an extent in the scanning direction which is less than or equal to 132 mm and an extent in a second direction which is perpendicular to the scanning direction which is at least around 104 mm, and projecting an exposure slit of radiation which is reflected from the mask onto the exposure region of the substrate with a demagnification in the scanning direction which is greater than a demagnification in the second direction.

The radiation may be EUV radiation.

The demagnification in the scanning direction may be greater than 6×.

The demagnification in the second direction may be at least around 4×.

The demagnification in the second direction may be greater than 4×.

The demagnification in the second direction may be greater than 4.5×.

The mask may have a length in the scanning direction which is less than or equal to around 6 inches.

The mask may have a length in the second direction of about 6 inches.

The patterned area may be disposed on a quality area of the mask.

The quality area of the mask may have an extent in the scanning direction of approximately 132 mm.

The quality area of the mask may have an extent in the second direction of approximately 132 mm.

The quality area of the mask may have rounded corners.

The rounded corners may each have a radius of approximately 14 mm.

The extent of the patterned area in the second direction and the demagnification in the second direction may be such that the extent in the second direction of the exposure region on the substrate is around 26 mm.

The extent of the patterned area in the scanning direction and the demagnification in the scanning direction may be such that the extent in the scanning direction of the exposure region on the substrate is around 16.5 mm According to a fifth aspect of the invention there is provided a lithographic apparatus comprising a support structure constructed to support a mask comprising a patterned area which is capable of imparting a radiation beam with a pattern in its cross-section to form a patterned radiation beam, wherein the support structure is movable in a scanning direction and wherein the mask has an extent in the scanning direction of about 6 inches and has an extent in a second direction which is perpendicular to the scanning direction of about 6 inches, a substrate table constructed to hold a substrate, wherein the substrate table is movable in the scanning direction, and a projection system configured to project the patterned radiation beam onto an exposure region of the substrate, wherein the projection system has a demagnification in the scanning direction which is greater than a demagnification in the second direction.

The radiation beam may be an EUV radiation beam.

The projection system may have a demagnification in the scanning direction of greater than 6×.

The projection system may have a demagnification in the second direction of at least around 4× and specifically around 4.8× 5× or 5.1×.

The projection system may have a demagnification in the second direction of greater than 4× and specifically around 6.3×, 7×, 7.5× or 7.9×.

The projection system may have a demagnification in the second direction of greater than 4.5×.

The patterned area may be disposed on a quality area of the mask.

The quality area of the mask may have an extent in the scanning direction of approximately 132 mm.

The quality area of the mask may have an extent in the second direction of approximately 132 mm.

The quality area of the mask may have an extent in the scanning direction of approximately 124 mm.

The quality area of the mask may have an extent in the second direction of approximately 124 mm.

The quality area of the mask may have rounded corners.

The rounded corners may each have a radius of approximately 14 mm.

The demagnification of the projection system in the second direction may be configured such that the extent in the second direction of the exposure region on the substrate is around 26 mm.

The demagnification of the projection system in the scanning direction may be configured such that the extent in the scanning direction of the exposure region on the substrate is around 16.5 mm The support structure may be further constructed to support an extended mask comprising an extended patterned area which is capable of imparting an EUV radiation beam with a pattern in its cross-section to form a patterned radiation beam, wherein the extended mask has an extent in the scanning direction which is greater than 6 inches.

The extent of the extended patterned area in the scanning direction may be greater than 132 mm.

The extent of the extended patterned area in the scanning direction may be about 264 mm The extent of the extended patterned area in the second direction may be at least about 104 mm.

The extent of the extended patterned area in the second direction may be greater than 104 mm.

The extent of the extended patterned area in the second direction may be about 132 mm.

The lithographic apparatus may further comprise a second support structure constructed to support an extended mask comprising an extended patterned area which is capable of imparting a radiation beam with a pattern in its cross-section to form a patterned radiation beam, wherein the extended mask has an extent in the scanning direction which is greater than 6 inches.

The radiation beam may be an EUV radiation beam.

The extent of the extended patterned area in the scanning direction may be greater than 132 mm.

The extent of the extended patterned area in the scanning direction may be about 264 mm The extent of the extended patterned area in the second direction may be at least about 104 mm.

The extent of the extended patterned area in the second direction may be greater than 104 mm.

BRIEF DESCRIPTION OF THE DRAWINGS

Embodiments of the invention will now be described, by way of example only, with reference to the accompanying drawings, in which:

FIG. 1 is a schematic depiction of a lithographic system comprising a lithographic apparatus and a radiation source;

FIG. 2a and FIG. 2b are schematic depictions of a mask which may be used in a scanning exposure process and an exposure field on a substrate which results from the exposure process;

FIG. 5a and FIG. 5b are schematic depictions of two embodiments of exposure fields formed on a substrate;

FIG. 6 is a schematic depiction of a mask which includes a patterned area which is expanded in an x-direction; and FIG. 7a and FIG. 7b are schematic depictions of an extended mask which may be used in a scanning exposure process and an exposure field on a substrate which results from the exposure of the extended mask.

DETAILED DESCRIPTION

Figure 3:
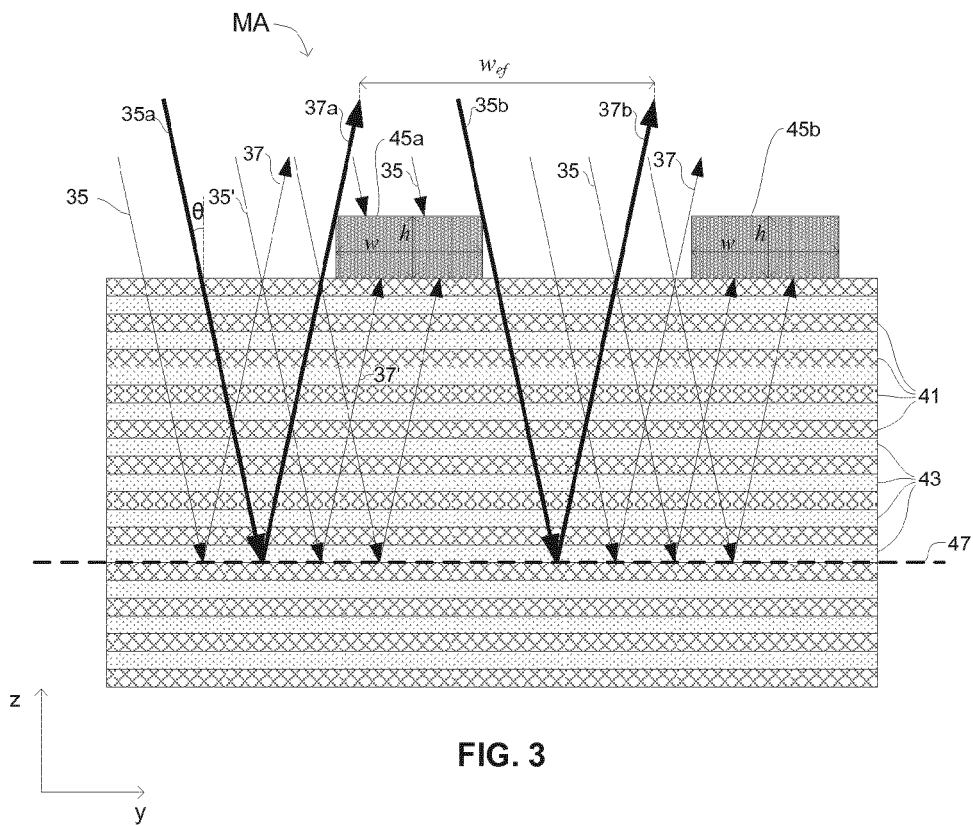
FIG. 3 is a cross-sectional view of a mask.

FIG. 1 shows a lithographic system. The lithographic system comprises a radiation source SO and a lithographic apparatus LA. The radiation source SO is configured to generate an extreme ultraviolet (EUV) radiation beam B. The lithographic apparatus LA comprises an illumination system IL, a support structure MT configured to support a patterning device MA (e.g. a mask), a projection system PS and a substrate table WT configured to support a substrate W. The illumination system IL is configured to condition the radiation beam B before it is incident upon the patterning device MA. The projection system PS is configured to project the radiation beam B (now patterned by the mask MA) onto the substrate W. The substrate W may include previously formed patterns. Where this is the case, the lithographic apparatus aligns the patterned radiation beam B with a pattern previously formed on the substrate W.

The radiation source SO, illumination system IL, and projection system PS may all be constructed and arranged such that they can be isolated from the external environment. A gas at a pressure below atmospheric pressure (e.g. hydrogen) may be provided in the radiation source SO. A vacuum may be provided in the illumination system IL and/or the projection system PS. A small amount of gas (e.g. hydrogen) at a pressure well below atmospheric pressure may be provided in the illumination system IL and/or the projection system PS.

The radiation source SO shown in FIG. 1 is of a type which may be referred to as a laser produced plasma (LPP) source. A laser 1, which may for example be a $CO_2$ laser, is arranged to deposit energy via a laser beam 2 into a fuel, such as tin (Sn) which is provided from a fuel emitter 3. Although tin is referred to in the following description, any suitable fuel may be used. The fuel may for example be in liquid form, and may for example be a metal or alloy. The fuel emitter 3 may comprise a nozzle configured to direct tin, e.g. in the form of droplets, along a trajectory towards a plasma formation region 4. The laser beam 2 is incident upon the tin at the plasma formation region 4. The deposition of laser energy into the tin creates a plasma 7 at the plasma formation region 4. Radiation, including EUV radiation, is emitted from the plasma 7 during de-excitation and recombination of ions of the plasma.

The EUV radiation is collected and focused by a near normal incidence radiation collector 5 (sometimes referred to more generally as a normal incidence radiation collector). The collector 5 may have a multilayer structure which is arranged to reflect EUV radiation (e.g. EUV radiation having a desired wavelength such as 13.5 nm). The collector 5 may have an elliptical configuration, having two ellipse focal points. A first focal point may be at the plasma formation region 4, and a second focal point may be at an intermediate focus 6, as discussed below.

The laser 1 may be separated from the radiation source SO. Where this is the case, the laser beam 2 may be passed from the laser 1 to the radiation source SO with the aid of a beam delivery system (not shown) comprising, for example, suitable directing mirrors and/or a beam expander, and/or other optics. The laser 1 and the radiation source SO may together be considered to be a radiation system.

Radiation that is reflected by the collector 5 forms a radiation beam B. The radiation beam B is focused at point 6 to form an image of the plasma formation region 4, which acts as a virtual radiation source for the illumination system IL. The point 6 at which the radiation beam B is focused may be referred to as the intermediate focus. The radiation source SO is arranged such that the intermediate focus 6 is located at or near to an opening 8 in an enclosing structure 9 of the radiation source.

Although FIG. 1 depicts the radiation source SO as a laser produced plasma LPP source, any suitable source may be used to generate EUV radiation. For example, EUV emitting plasma may be produced by using an electrical discharge to convert fuel (e.g. tin) to a plasma state. A radiation source of this type may be referred to as a discharge produced plasma (DPP) source. The electrical discharge may be generated by a power supply which may form part of the radiation source or may be a separate entity that is connected via an electrical connection to the radiation source SO.

The radiation source SO may alternatively comprise a free electron laser. A free electron laser may produce EUV radiation by accelerating electrons to relativistic speeds. The relativistic electrons are then passed through an undulating magnetic field which causes the relativistic electrons to follow an oscillating path thereby causing stimulated emission of coherent EUV radiation. A free electron laser may produce enough EUV radiation to simultaneously provide EUV radiation to several lithographic apparatus LA.

The radiation beam B passes from the radiation source SO into the illumination system IL, which is configured to condition the radiation beam. The illumination system IL may include a facetted field mirror device 10 and a facetted pupil mirror device 11. The faceted field mirror device 10 and faceted pupil mirror device 11 together provide the radiation beam B with a desired cross-sectional shape and a desired angular distribution. The radiation beam B passes from the illumination system IL and is incident upon the patterning device MA held by the support structure MT. The patterning device MA reflects and patterns the radiation beam B. The illumination system IL may include other mirrors or devices in addition to or instead of the faceted field mirror device 10 and faceted pupil mirror device 11.

Following reflection from the patterning device MA the patterned radiation beam B enters the projection system PS. The projection system PS comprises a plurality of mirrors which are configured to project the radiation beam B onto a substrate W held by the substrate table WT. The projection system PS applies a reduction factor to the radiation beam, forming an image with features that are smaller than corresponding features on the patterning device MA. Although the projection system PS has two mirrors in FIG. 1, the projection system may include any number of mirrors (e.g. six, seven, eight, nine or ten mirrors).

The projection system PS, focuses the radiation beam B onto a target portion of the substrate W. The target portion may be referred to as an exposure field. The substrate table WT can be moved accurately, e.g. so as to position different target portions in the path of the radiation beam B. The substrate table WT may, for example, be positioned by one or more positioners (not shown). In order to increase the accuracy with which the substrate table is positioned, one or more position sensors (not shown) may be used to measure the position of the substrate table WT relative to the radiation beam B. Measurements made by the one or more position sensors may be fed back to the one of more positioners.

The depicted apparatus may, for example, be used in a scan mode, wherein the support structure (e.g. mask table) MT and the substrate table WT are scanned synchronously while a pattern imparted to the radiation beam is projected onto a substrate W (i.e. a dynamic exposure). The velocity and direction of the substrate table WT relative to the support structure (e.g. mask table) MT may be determined by the demagnification and image reversal characteristics of the projection system PS. The patterned radiation beam which is incident upon the substrate W may comprise a band of radiation. The band of radiation may be referred to as an exposure slit. During a scanning exposure, the movement of the substrate table WT and the support structure MT may be such that the exposure slit travels over an exposure field of the substrate W.

In an embodiment of the invention, the lithographic apparatus may be configured to support masks MA which measure 6 inches by 6 inches (these may be referred to as 6 inch masks). This is the conventional mask size for use in a lithographic apparatus, and considerable infrastructure exists which is set up to manufacture and use masks of this size. It may therefore be advantageous for a lithographic apparatus to be capable of using 6 inch masks.

FIG. 2*a* is a schematic depiction of a conventional 6 inch mask MA for an EUV lithographic apparatus. The mask MA comprises a reflective material. For example, the mask MA may comprise a multilayer mirror which is optimized to reflect EUV radiation. The mask MA includes a patterned area 21 on which a pattern to be imparted to the radiation beam B is formed. For example, a pattern may be formed on the patterned area 21 by providing EUV-absorbing material on the surface of the reflective mask MA.

During a scanning exposure of the mask MA, the patterned area 21 is illuminated with EUV radiation. Also shown in FIG. 2*a* is an exposure slit 23. The exposure slit 23 represents the portion of the mask MA which is illuminated with EUV radiation at a given time during a scanning exposure. The exposure slit 23 is shown in FIG. 2*a* as having a rectangular shape, however the exposure slit 23 may have a different shape. For example, the exposure slit 23 may be curved.

During a scanning exposure the exposure slit 23 is scanned over the patterned area 21 in the directions which are indicated by the double-headed arrow in FIG. 2*a*. The scanning direction is conventionally referred to as the y-direction (Cartesian coordinates are indicated in FIG. 2 for ease of reference). Movement of the exposure slit 23 relative to the mask MA may be in the positive or negative y-direction. Scanning of the exposure slit 23 over the patterned area 21 is typically achieved through movement of the mask MA (in the y-direction) whilst the exposure slit 23 remains stationary.

In some embodiments, a region of the mask MA which extends outside of the patterned area 21 may be illuminated with EUV radiation. For example, the region which is illuminated with EUV radiation may extend to a greater width on the mask MA than the patterned area 21. However regions of the mask MA outside of the patterned area 21 may be provided with an EUV-absorbing material such that EUV radiation is only reflected from portions of the mask MA which lie inside the patterned area 21.

FIG. 2*b* schematically depicts an exposure region 31 of a substrate W which is exposed to radiation during a scanning exposure of the mask MA depicted in FIG. 2. Also shown in FIG. 2*b* is the exposure slit 23. Typically during a scanning exposure, the substrate W is scanned in the y-direction synchronously to the scanning of the mask MA (also in the y-direction) such that the exposure slit 23 is scanned over the patterned area 21 of the mask MA and the exposure region 31 of the substrate W.

The size of a region of the substrate W which is exposed to radiation during a single scanning exposure depends on the magnification of the projection system PS. Typically a projection system PS applies a demagnification to the band of radiation (forming the exposure slit 23) which passes from the mask MA to the substrate W. This results in features being patterned on the substrate W which have smaller dimensions than corresponding features which of the pattern which is imparted to the patterned radiation beam by the mask MA.

A projection system PS of a conventional lithographic apparatus LA may apply a demagnification of approximately 4× in both the x-direction and the y-direction. A conventional 6 inch mask may include a patterned area 21 which extends approximately 104 mm in the x-direction and approximately 132 mm in the y-direction. In this case the exposure region 31 on the substrate W extends approximately 26 mm in the x-direction and approximately 33 mm in the y-direction.

It may however, be advantageous to increase the demagnification of a projection system PS in at least one of the x and/or y-directions. As will be explained below, it may in particular be advantageous to increase the demagnification of a projection system PS in the y-direction.

The advantages of increasing the demagnification of a projection system PS (to larger demagnifications than the 4× demagnification of a conventional projection system PS) will now be described with reference to FIG. 3. FIG. 3 is a cross-sectional view of a portion of a mask MA. For ease of comparison between FIGS. 2 and 3 the same Cartesian coordinate system as was used in FIG. 2 is also shown in FIG. 3. The x-direction which is shown in FIG. 2 is perpendicular to the plane of the page in FIG. 3. The z-direction which is shown in FIG. 3 is perpendicular to the plane of the page in FIG. 2.

The mask MA comprises a plurality of pairs of alternating layers of a first material 41 and a second material 43. The first material 41 and the second material 43 have different refractive indices. The thicknesses and refractive indices of the layers of material 41, 43 are such that the materials act as a multilayer mirror structure.

A series of rays 35 of EUV radiation are depicted by arrows in FIG. 3 as being incident on the mask MA. The change of refractive index which occurs at interfaces between layers of the first material 41 and layers of the second material 43 causes some EUV radiation to be reflected from each interface. For example, a portion of EUV radiation may be reflected from the uppermost interface between the first and second materials 41, 43 with the remainder of the radiation being transmitted to lower layers. Portions of the transmitted radiation may then be reflected from interfaces between the first and second materials which are situated within the multilayer structure of the mask MA. Reflections from different interfaces in the mask MA constructively interfere with each other to form reflected rays 37. The combined effect of reflection from many different layers of the mask MA may be considered to be equivalent to the reflected EUV radiation being reflected from an effective plane of reflection 47 which lies within the multilayer mirror structure. The effective plane of reflection 47 may, for example, be positioned approximately 16 layers below the upper surface of the mask MA as shown in FIG. 3. All of the incident rays 35 of radiation are depicted in FIG. 3 as being reflected from the effective plane of reflection 47. However it should be appreciated that some radiation may be reflected from positions above the effective plane of reflection 47 and some radiation may be reflected from positions below the effective plane of reflection 47.

As will be appreciated from FIG. 1 and FIG. 3, the beam of EUV radiation which is incident on the mask MA is not perpendicularly incident on the mask MA. The angle subtended by the beam of radiation relative to a perpendicular which extends from the mask MA (i.e. the angle between the radiation beam and the z-axis) may be referred to as the chief ray angle $\theta$ (shown in FIG. 3). In practice the mask MA may be illuminated from a range of angles and the chief ray angle $\theta$ may be considered to be the mean of these angles. For ease of illustration only the rays which are incident on the mask MA at the chief ray angle $\theta$ are illustrated in FIG. 3.

A pattern is formed on the mask MA by providing regions of EUV-absorbing material 45 on the upper surface of the multilayer mirror structure. Two-blocks of EUV-absorbing material 45a, 45b are depicted in FIG. 3. The blocks 45a, 45b each have a width w and a height h. If EUV radiation were to be perpendicularly incident (i.e. with a chief ray angle $\theta$ of zero) upon the mask MA then the height h of the blocks of EUV-absorbing material 45a, 45b would have no effect on the radiation which is reflected from the mask MA. However, because the EUV radiation is incident on the mask MA with a non-zero chief ray angle $\theta$, some of the radiation which is reflected by the multilayer structure of the mask MA is subsequently absorbed by a block of EUV-absorbing material 45a, 45b. For example, the ray 35' which is depicted in FIG. 3 is incident on a portion of the upper surface of the mask MA which is not provided with EUV-absorbing material and is therefore reflected from the effective plane of reflection 47. However, the corresponding reflected ray 37' is absorbed by the block of EUV-absorbing material 45a and does not therefore leave the mask MA.

The incident ray 35a (which is depicted with a thick line in FIG. 3) represents the closest ray to the left-hand side of the block 45a which still results in a reflected ray 37a that leaves the mask MA (and which is not therefore absorbed by the block 45a). The incident ray 35b (which is also depicted with a thick line in FIG. 3) represents the closest ray to the right-hand side of the block 45a which is not absorbed by the block 45a and therefore results in a reflected ray 37b. The separation between the reflected rays 37a and 37b represents the effective width $w_{ef}$ of the absorbing block 45a which is patterned in to the radiation which is reflected from the mask MA. As can be seen in FIG. 3, the absorbing block 45a has an effective width $w_{ef}$ which is considerably greater than the width w of the block 45a.

As will be appreciated from FIG. 3 and the description provided above, any increase in the chief ray angle $\theta$ will result in an increase in the effective width $w_{ef}$ of features which are patterned onto the mask MA. An increase in the effective width $w_{ef}$ of patterned features may be undesirable since this may result in an increase in the achievable critical dimension (CD) of features which can be patterned onto the substrate W.

The chief ray angle $\theta$ may be selected taking into account the numerical aperture of the projection system PS at the entrance of the projection system. In particular the chief ray angle $\theta$ may be selected such that the capture angle of radiation captured by the projection system PS does not overlap with a perpendicular line which extends from the mask MA. As was described above in relation to equation 1, in order to decrease the achievable CD of a lithographic apparatus it may be desirable to increase the numerical aperture (NA) of the projection system PS. However because the capture angle of the projection system PS increases as the numerical aperture of the projection system PS increases, an increase of the numerical aperture on the entrance side of the projection system PS must be accompanied by an increase of the chief ray angle θ (which may be undesirable as was described above with reference to FIG. 3).

Increasing the demagnification of a projection system PS is advantageous since it allows the numerical aperture on the substrate side of the projection system PS to be increased without increasing the numerical aperture on the mask side of the projection system PS. In this context the term "substrate side of the projection system" is intended to mean the portion of the projection system PS which is closest to the substrate table WT. The term "mask side of the projection system" is intended to mean the portion of the projection system PS which is closest to the support structure MT.

Increasing the demagnification of the projection system PS therefore allows the numerical aperture on the substrate side of the projection system PS to be increased (thereby advantageously decreasing the critical dimension) without the need to increase the numerical aperture on the mask side of the projection system PS (thereby avoiding the need to increase the chief ray angle θ). The disadvantageous effects of increasing the chief ray angle θ which were described above with reference to FIG. 3 may therefore be avoided whilst achieving a reduction in the critical dimension.

It will be appreciated from the description above in relation to FIG. 3 that the effects of the chief ray angle θ on the achievable critical dimension only applies to the dimension of features which extend in the y-direction (e.g. the effective width $w_{ef}$ of absorbing blocks 45a, 45b). The achievable critical dimension in the x-direction is not affected by the chief ray angle θ. Illumination in the x-direction has a chief ray angle which is perpendicular to the mask MA, and thus the problem illustrated in FIG. 3 does not arise.

It is therefore an increase in the demagnification of the projection system PS in the y-direction which is particularly advantageous in decreasing the achievable critical dimension. The demagnification of a projection system PS may therefore be advantageously increased in the y-direction without a corresponding increase in the demagnification in the x-direction. A projection system PS which applies a different demagnification factor in the x and y-directions may be referred to as an anamorphic projection system PS.

Figures 4A, 4B:
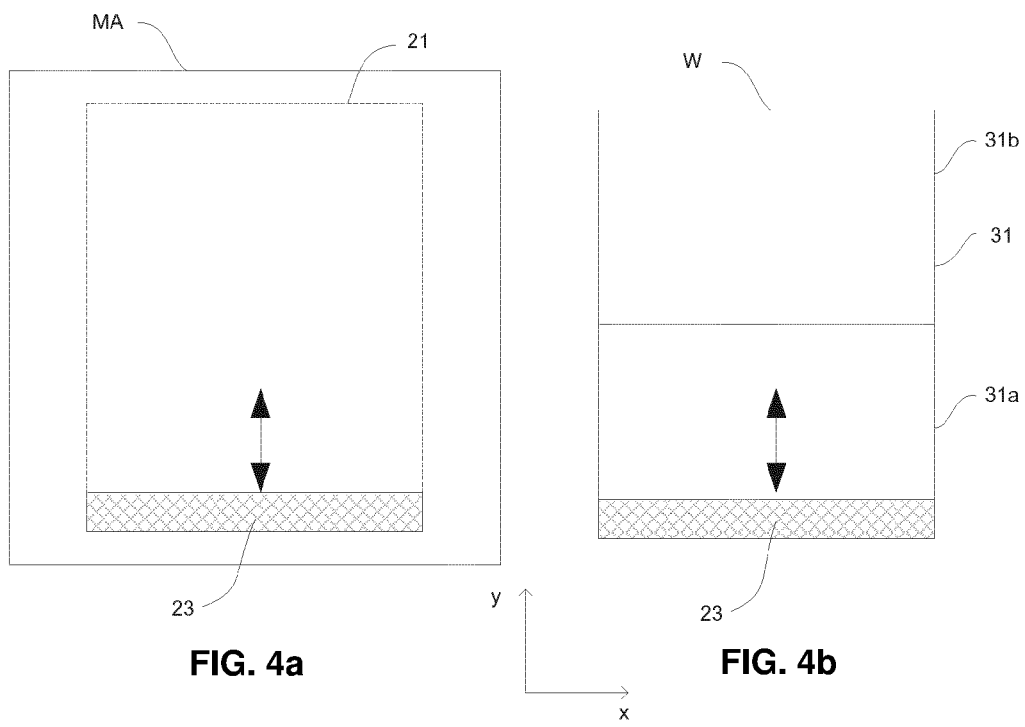
FIG. 4a and FIG. 4b are schematic depictions of a mask which may be used in a scanning exposure process and an exposure field on a substrate which is formed from two scanning exposure processes.

FIG. 4a is a schematic depiction of a mask MA including a patterned area 21 as was depicted in FIG. 2a. FIG. 4b is a schematic representation of an exposure region 31 on a substrate W which may result from two scanning exposures of the mask MA. The mask MA may be a conventional 6 inch mask having a patterned area 21 which extends approximately 104 mm in the x-direction and approximately 132 mm in the y-direction. According to an embodiment of the invention a scanning exposure of the mask MA shown in FIG. 4 may be performed with an anamorphic projection system PS which applies a demagnification of approximately 4× in the x-direction and a demagnification of approximately 8× in the y-direction. A single scanning exposure of the patterned area 21 of the mask MA shown in FIG. 4a therefore results in exposure of a first field 31a on the substrate W. The first field 31a on the substrate W may extend approximately 26 mm in the x-direction and approximately 16.5 mm in the y-direction. The extent in the y-direction of the first field 31a is approximately half of the extent in the y-direction of an exposure region on a substrate W (e.g. the exposure region 31 depicted in FIG. 2a) which results from a conventional lithographic apparatus having a projection system PS which applies a demagnification of approximately 4× in both the x and y-directions. An exposure region on a substrate W which results from a conventional lithographic apparatus having a projection system PS which applies a demagnification of approximately 4× in both the x and y-directions may be referred to as a full-field 31. Since the first field 31a has an area which is approximately half that of a full-field, the first field 31a may be referred to as a first half-field 31a.

As was described above the first half-field 31a has an extent in the y-direction which is approximately half that of the extent in the y-direction of a full-field. In order to expose a region of the substrate W which is equivalent to a full-field, a second half-field 31b may also be exposed. The first half-field 31a and the second half-field 31b together cause the exposure of a combined exposure region 31 which has equivalent dimensions to a conventional full-field.

FIG. 5 is a schematic depiction of two embodiments of a combined exposure region 31 which may be formed by exposing two half fields 31a, 31b. FIG. 5a depicts an embodiment in which the first half field 31a comprises a first die 51a and scribe lanes 53a which surround the first die 51a. The second half field 31b comprises a second die 51b and scribe lanes 53b which surround the second die 51b. Patterns such as alignment marks and other features may be provided in the scribe lanes 53a and in the scribe lanes 53b.

The first die 51a and the second die 51b may be the same as each other. Similarly the scribe lanes 53a and the scribe lanes 53b may be the same as each other. Thus, in an embodiment the same mask MA may be used to expose both the first half-field 31a and the second half-field 31b. In an embodiment the mask MA may, for example, be a conventional 6 inch mask which includes a patterned area 21 which extends approximately 104 mm in the x-direction and approximately 132 mm in the y-direction. The first half-field 31a and the second half-field 31b may be exposed using an anamorphic projection system PS which applies a demagnification of approximately 4× in the x-direction and approximately 8× in the y-direction. Each of the first half-field 31a and the second half field 31b may therefore extend approximately 26 mm in the x-direction and approximately 16.5 mm in the y-direction.

FIG. 5b depicts an embodiment in which the first half-field 31a comprises a first portion of a die 51c and the second half-field 31b comprises a second portion of the die 51c. The die 51c is surrounded by scribe lanes 53c. A first portion of the scribe lanes 53c are formed as part of the first half-field 31a and a second portion of the scribe lanes 53c are formed as part of the second half-field 31b.

The first half-field 31a shown in FIG. 5b may be formed by exposing a first mask MA which is provided with a first portion of the pattern which forms the die 51c. The second half-field 31b may be formed by exposing a second mask MA which is provided with a second portion of the pattern which forms the die 51c. The first and second portions of the pattern may include features which connect with one another, for example, along an edge where the first half-field 31a and the second half-field 31b adjoin one another. The practice of aligning features of the first and second patterns such that they connect with one another may be referred to as stitching. Features of the first and second patterns which connect with each other may have a critical dimension which is greater than the critical dimension of features in other parts of the patterns. The greater critical dimension of these features may provide an increased tolerance to errors in the alignment of the two patterns. This may reduce the likelihood of an unsuccessful connection between features of the first and second patterns which could cause an integrated circuit or other device to not operate correctly.

In an embodiment the first and second masks MA which are exposed to form the combined exposure region 31 in FIG. 5b may both be conventional 6 inch masks which include patterned areas 21 which extend approximately 104 mm in the x-direction and approximately 132 mm in the y-direction. The first half-field 31a and the second half-field 31b may both be exposed using an anamorphic projection system PS which applies a demagnification of approximately 4× in the x-direction and approximately 8× in the y-direction. The first half-field 31a and the second half field 31b of FIG. 5b may therefore extend approximately 26 mm in the x-direction and approximately 16.5 mm in the y-direction.

The advantages of, in particular, increasing the demagnification of a projection system PS in the y-direction were discussed above. However, increasing the demagnification in the x-direction (e.g. to a demagnification of 5×) is also advantageous. In particular, increasing the demagnification of the projection system PS reduces the sensitivity of the pattern which is exposed on the substrate W to defects on the mask MA. This is because the size of the defect is reduced more than would be the case if a conventional 4× demagnification were to be used. Similarly, increasing the demagnification of the projection system PS reduces the sensitivity of the exposed pattern to contamination particles on the mask. Again, this is because the size of the image of the contamination particle at the substrate is reduced.

Additionally the radiation dose which is received at a substrate W is increased by increasing the demagnification of the projection system PS. This is because increasing the demagnification of the projection system PS decreases the size of the region of the substrate which is exposed to a given amount of radiation. The radiation dose per unit area on the substrate W therefore increases. This may be advantageous because it increases the difference in radiation dose which is received at the substrate W between regions of the pattern on the substrate W which are exposed to EUV radiation and regions of the pattern on the substrate W which are not exposed to EUV radiation. This difference in dose may be referred to as the contrast with which a pattern is transferred to a substrate W. It may be desirable to increase the contrast of a pattern on the substrate, and this may be achieved by increasing the demagnification of the projection system.

In general, there are therefore advantages which result from increasing the demagnification in both the x-direction and the y-direction. However, it will be appreciated that for a given patterned area 21 on a mask MA an increase in the demagnification of the projection system PS causes a reduction in the exposure field which is patterned onto the substrate W with a single scanning exposure of the patterned area 21. It may be desirable to expose a given exposure region of a substrate W. A decrease in the exposure field which results from a single scanning exposure of a mask MA may therefore increase the number of scanning exposures which must be performed in order to expose the given exposure region of the substrate W. An increase in the number of scanning exposures which must be performed may cause an undesirable decrease in the throughput of the lithographic apparatus LA.

In the embodiments described above with reference to FIGS. 5a and 5b, an increase in the demagnification in the y-direction (from 4× to 8×) means that two scanning exposures are required to expose the exposure region 31. This may therefore cause a reduction in the throughput of the lithographic apparatus. However, the corresponding decrease in the achievable critical dimension in the y-direction may be sufficiently advantageous that such a reduction in throughput is justified.

It will be appreciated that in the embodiments described above the use of an anamorphic projection system PS allows the demagnification in the y-direction to be increased such that it is greater than the demagnification in the x-direction. This allows the achievable critical dimension to be reduced whilst limiting any accompanying reduction in throughput of the lithographic apparatus. For example, maintaining a demagnification of 4× in the x-direction allows half-fields 31a, 31b to be exposed which have the same extent in the x-direction as a full-field 31. This means that only two scanning exposures are required to expose a full-field 31. By contrast if the demagnification in the x-direction were also to be increased to 8× then 4 scanning exposures would be required to expose a full-field 31 and thus a greater reduction in throughput would occur.

One possible way of limiting a reduction in throughput of a lithographic apparatus whilst increasing the demagnification of a projection system PS is to increase the size of the mask MA. However, considerable infrastructure exists which is set up to manufacture and use conventional 6 inch masks. It may therefore be advantageous for a lithographic apparatus to be capable of using 6 inch masks. However, it will be appreciated from for example, FIG. 2a and FIG. 4a that a conventional patterned area 21 (extending approximately 104 mm in the x-direction and 132 mm in the y-direction) on a 6 inch mask MA leaves a substantial portion of the mask MA which is not taken up by the patterned area 21.

Some of the mask MA which is not taken up by the patterned area 21 may be required for purposes other than patterning a radiation beam to which a substrate W is exposed. For example, a portion of the mask MA outside of the patterned area 21 may be required to hold the mask MA in place on the support structure MT. Other portions of the mask MA outside of the patterned area 21 may be provided with alignment marks which are used to align the mask MA. However there remains potential to expand the patterned area 21 of a mask MA whilst still providing a portion of the mask MA which may be used for other purposes such as those described above. In particular, the patterned area 21 of a mask MA may be expanded in the x-direction.

FIG. 6 is a schematic representation of a 6 inch mask MA which includes a region 22 which may accommodate a patterned area 21. The region 22 which may accommodate a patterned area 21 may be referred to as a quality area 22. The quality area 22 may extend approximately 132 mm in the x-direction and approximately 132 mm in the y-direction. The quality area 22 has rounded corners 25 as shown in FIG. 6. The rounded corners 25 may, for example, each have a radius of approximately 14 mm. Alternatively the rounded corners 25 may each have a radius which is less than 14 mm. The quality area 22 limits the size of the patterned areas which may be accommodated by the mask MA. Outside the quality area, flatness of the mask and a coating uniformity of a coating applied to the mask may not be sufficient for using that part of the mask as a patterning area.

Also shown in FIG. 6 are three examples of patterned areas which may be disposed within the quality area 22. A conventional patterned area 21 is shown in FIG. 6 and may, for example have an extent in the x-direction of approximately 104 mm and an extent in the y-direction of approximately 132 mm. A scanning exposure of the conventional patterned area 21 may be performed with an anamorphic projection system PS having a demagnification of approximately 4× in the x-direction and approximately 8× in the y-direction. This results in the exposure of a half-field on the substrate W (i.e. an exposure field having an extent in the x-direction of approximately 26 mm and an extent in the y-direction of approximately 16.5 mm) as was described above.

Also shown in FIG. 6 is an embodiment of a mask having a second patterned area 21a which has an extent in the x-direction which is greater than the extent in the x-direction of the conventional patterned area 21. However, due to the rounded corners 25 of the quality area 22, the extent in the y-direction of the second patterned area 21a is reduced when compared to the conventional patterned area 21. In a preferred embodiment, the second patterned area 21a has an extent in the x-direction of approximately 124 mm and an extent in the y-direction of approximately 124 mm. A scanning exposure of the second patterned area 21a may be performed with a lithographic system having an anamorphic projection system PS having a demagnification of approximately 4.8× in the x-direction and approximately 7.5× in the y-direction. This results in the exposure of a half-field on the substrate W.

Also shown in FIG. 6 is a third patterned area 21b which has an extent in the x-direction which is greater than the extent in the x-direction of the conventional patterned area 21 and the second patterned area 21a. However, due to the rounded corners 25 of the quality area 22, the extent in the y-direction of the third patterned area 21b is reduced when compared to both the conventional patterned area 21 and the second patterned area 21a. The third patterned area 21b may, for example, have an extent in the x-direction of approximately 132 mm and an extent in the y-direction of approximately 104 mm. A scanning exposure of the third patterned area 21b may be performed with an anamorphic projection system PS having a demagnification of approximately 5.1× in the x-direction and approximately 6.3× in the y-direction. This results in the exposure of a half-field on the substrate W. If necessary, the illumination system IL of the lithographic apparatus may be modified in order to enable the exposure slit to extend across approximately 132 mm in the x-direction.

The second and third patterned areas 21a, 21b shown in FIG. 6 both have an extent in the x-direction which is greater than that of a conventional patterned area 21. Patterned areas 21a, 21b which have a greater extent in the x-direction than a conventional patterned area 21 may allow the demagnification of a projection system PS to be increased in the x-direction as well as in the y-direction. The extent of a patterned area 21a, 21b and the demagnification of a projection system PS may be configured such that exposure of the patterned area 21a, 21b on the mask MA results in the exposure of a half-field on the substrate W. For example, exposure of a patterned are 21a, 21b may require an anamorphic projection system PS which has a demagnification of greater than 4× in the x-direction in order to expose a half-field on the substrate W. A patterned area 21a, 21b which has an extent in the x-direction which is greater than the extent in the x-direction of a conventional patterned area 21 may, for example, be used with an anamorphic projection system having a demagnification in the x-direction of greater than 4× in order to expose the half-fields 31a, 31b depicted in FIGS. 4 and 5.

Using an anamorphic projection system PS with a demagnification in the x-direction of greater than 4× is advantageous since increasing the demagnification of the projection system PS reduces the effect of defects on the mask and reduces the effect of contamination particles on the mask. Increasing the demagnification in the x-direction of an anamorphic projection system PS also advantageously increases the contrast in the x-direction of features which are patterned onto a substrate W. An anamorphic projection system may, for example, have a demagnification in the x-direction which is greater than 4.5×.

It will be appreciated from the examples of second and third patterned areas 21a, 21b which were described above in connection with FIG. 6, that the rounded corners 25 of the quality area 22 mean that an increase in the extent of a patterned area in the x-direction may require a decrease in the extent of the patterned area in the y-direction in order to ensure that the patterned area fits inside the quality area 22. As was described above it may be desirable that exposure of a patterned area on the mask MA results in the exposure of a half-field on the substrate W. An increase in the extent in the x-direction of a patterned area may therefore advantageously allow the demagnification in the x-direction to be increased. However, this may require a decrease in the extent in the y-direction of the patterned area, which may in turn require a decrease in the demagnification in the y-direction (relative to a demagnification in the y-direction of 8×). In general the demagnification in the y-direction may be greater than about 6×.

The extent in the x and y-directions of a patterned area on a mask MA and the demagnification in the x and y-directions of an anamorphic projection system PS may be selected according to a balance of the relative advantages and disadvantages of increasing and decreasing the demagnification of an anamorphic projection system PS in the x and y-directions. Parameters that are taken into account in such a selection may comprise at least one of contrast, mask error factor and defect printability threshold. Defect printability threshold of a lithographic process is defined as the threshold value of the size of defects in the pattern of the mask below which threshold value such defects are not imaged onto the substrate. For example, comparing the second patterned area 21a with a conventional patterned area 21, use of the second patterned area will lead to a reduction in the demagnification in the y-direction of approximately 6% (starting from a demagnification of 8×). This causes a reduction in the contrast of the pattern on the substrate W of approximately 6%. However the demagnification and the contrast in the x-direction will increase by approximately 20% (starting from a demagnification of 4×). A 20% increase in the demagnification in the x-direction means that the sensitivity of a pattern on the substrate W to defects in the pattern on the mask MA and contamination particles on the mask is reduced by approximately 20% in the x-direction. The decrease in the extent of the second patterned area 21a in the y-direction when compared to a conventional patterned area 21 means that the length over which an exposure slit 23 is scanned during a scanning exposure is reduced. This may reduce the amount of time required to perform a single scanning exposure of a patterned area which may lead to an increase in the throughput of a lithographic apparatus.

An additional advantage of the second patterned area 21b is that the total area of the second patterned area 21a is approximately 12% larger than the area of a conventional patterned area 21. This means that during a scanning exposure of the patterned areas the same amount of EUV radiation is spread over a larger area during exposure of the second patterned area 21a when compared to a conventional patterned area 21. Any heating of a mask MA which results from exposure to EUV radiation will therefore be reduced in the case of the second patterned area 21a. This may be advantageous since heating of a mask MA may cause undesirable expansion of the mask MA which may cause distortion of the pattern on the mask MA.

Specific embodiments of patterned areas 21, 21a, 21b and corresponding demagnification values have been described above. However, it should be appreciated that the advantages which were described in relation to these embodiments are not limited to the specific dimensions of patterned areas and values of demagnification which were described. For example, in an alternative embodiment, a lithographic system may have an anamorphic projection system PS having a demagnification of approximately 4.4× in x and a demagnification of approximately 7.9× in y. In this embodiment, the second patterned area 21a has an extent in the x-direction of approximately 114 mm and an extent in the y-direction of approximately 130 mm. In yet a further embodiment, a lithographic system may have an anamorphic projection system PS having a demagnification of approximately 5.1× in x and a demagnification of approximately 6.3× in y. In this embodiment, the second patterned area 21a has an extent in the x-direction of approximately 132 mm and an extent in the y-direction of approximately 104 mm. In general, it is advantageous to expose an exposure region on a substrate W by scanning an exposure slit of radiation over a patterned area 21 of a mask MA which extends approximately 132 mm or less in the y-direction (the scanning direction) and at least about 104 mm or more in the x-direction.

In general an anamorphic projection system PS may have a demagnification in the x-direction which is greater than or equal to 4×. For example, the anamorphic projection system PS may have a demagnification in the x-direction of greater than 4.5×, greater than 4.8×, or 5× or more. The anamorphic projection system PS may have a demagnification in the y-direction which is greater than 6×. For example, the anamorphic projection system PS may have a demagnification in the y-direction which is greater than 6.5×, greater than 7× or greater than 7.5×.

Limiting the extent of the patterned area 21 of the mask to approximately 132 mm or less in the y-direction allows the patterned area 21 to fit onto a 6 inch mask MA. Providing a patterned area 21 of the mask MA which extends at least 104 mm in the x-direction allows the exposure region on the substrate W to have an extent in the x-direction which is greater than or equal to the extent in the x-direction of a conventional full exposure field.

The extent of a patterned area in the x and y-directions may be adjusted according to the requirements of an exposure process whilst ensuring that the patterned area fits inside a quality area 22 of a 6 inch mask. It may be desirable for the extent of a patterned area in the x-direction and the demagnification of the projection system in x-direction to be such that the extent in the x-direction of the exposure region on the substrate is approximately 26 mm. It may be further desirable for the extent of a patterned area in the y-direction and the demagnification of the projection system in y-direction to be such that the extent in the y-direction of the exposure region on the substrate is approximately 16.5 mm and thus the exposure region on the substrate has the dimensions of a half-field.

The demagnification in the x-direction may be increased to as much as 5× whilst still forming an exposure region on the substrate W which has an extent in the x-direction which is greater than or equal to the extent in the x-direction of a conventional full exposure field. This may be achieved by extending the patterned area 21 on a 6 inch mask in the x-direction. For example, the patterned area 21 may have an extent in the x-direction of up to approximately 132 mm.

The patterned area 21 may fit into a quality area 22 of the mask MA which has an extent in the x-direction of approximately 132 mm and an extent in the y-direction of approximately 132 mm. The quality area 22 may have rounded corners 25. The rounded corners 25 may each have a radius of approximately 14 mm or less.

It is advantageous to project the exposure slit 23 of radiation which is reflected from the mask MA onto the exposure region of the substrate with a demagnification in the y-direction which is greater than a demagnification in the x-direction. The achievable critical dimension in the y-direction is limited by the effects of the chief ray angle θ at which radiation is incident on the mask MA. Increasing the demagnification in the y-direction is therefore particularly advantageous in reducing the achievable critical dimension. There are also advantages associated with increasing the demagnification in the x-direction, however it is also advantageous to form an exposure region on the substrate W which has an extent in the x-direction which is equal to the extent in the x-direction of a conventional full exposure field. This allows a conventional full exposure field to be exposed with just two scanning exposures and therefore limits a reduction in throughput of a lithographic apparatus which may result from an increase in demagnification.

It will be appreciated from the description above that the achievable critical dimension of features may be different in the x and y-directions. The achievable critical dimension in the x and y-directions may depend on the extent of the patterned area on a mask MA and on the value of the demagnification of an anamorphic projection system PS in the x and y-directions. A designer of a device which is to be manufactured using a lithographic process as described above may align features of the device according to the achievable critical dimension in the x and y-directions. For example, the achievable critical dimension may be smaller in the y-direction than in the x-direction. In this case a designer of a device may align features of the device such that features of the device have their smallest dimension extending in the y-direction. When the device is exposed using the lithographic apparatus an illumination mode which provides a smaller critical dimension in the y-direction than in the x-direction may be used. For example, a dipole mode with poles spaced apart in the y-direction may be used. In general, in an embodiment of the invention an illumination mode may be used which includes radiation which has a greater separation in the y-direction than in the x-direction.

As was described above considerable infrastructure exists which is set up to manufacture and use 6 inch masks. It is therefore advantageous for a lithographic apparatus to include a support structure MT which is constructed to support a 6 inch mask and a projection system PS which has a demagnification in the y-direction (scanning direction) which is greater than a demagnification in the x-direction.

However, it may also be advantageous for a lithographic apparatus to be capable of supporting a mask MA which is larger than a 6 inch mask. FIG. 7a is a schematic depiction of an extended mask MA' which is larger than a 6 inch mask. In particular, the extended mask MA' has an extent in the y-direction which is greater than 6 inches. For example, the extended mask MA' may have an extent in the y-direction which is approximately twice the extent in the y-direction of a conventional 6 inch mask MA. An extended mask MA' includes an extended patterned area 21' which has an extent which is greater than the extent of a patterned area 21 which can fit onto a conventional 6 inch mask MA. For example, the extended patterned area 21' may have an extent in the y-direction of approximately 264 mm and thus may have an extent in the y-direction which is approximately twice the extent of the patterned area on a conventional 6 inch mask MA.

Increasing the extent of a patterned area 21' such that it has a greater extent than a patterned area 21 on a conventional 6 inch mask, increases the extent of the exposure region 31 which is formed on the substrate W. FIG. 7b is a schematic depiction of an exposure region 31 which is formed on a substrate W during a scanning exposure of the extended mask MA' which is depicted in FIG. 7a. The exposure region 31 may be formed using an anamorphic projection system PS which has a demagnification in the y-direction of approximately 8×. It can be seen from FIG. 7 that the extended patterned area 21' on the mask MA allows a full exposure field 31 to be exposed with a single scanning exposure and a demagnification in the y-direction of 8×. The full field 31 may, for example, have the dimensions of a conventional full-field (e.g. an extent in the y-direction of approximately 26 mm and an extent in the x-direction of approximately 33 mm).

Using an extended mask MA' to expose a full field 31 with a single scanning exposure may allow the throughput of a lithographic apparatus incorporating an anamorphic projection system PS to be increased. The exposure slit 23 may be scanned over the extended patterned area 21' at a faster speed than is usual in a conventional lithographic apparatus. For example, the scan speed may be increased by a factor of approximately 2, compared to a conventional lithographic apparatus. This may allow the extended patterned area 21' to be exposed in approximately the same time period as a conventional patterned area 21 is exposed.

In an embodiment, the extent in the x-direction of the extended patterned area 21' may be approximately 104 mm. In this embodiment the full exposure field 31 shown in FIG. 7b may be exposed in a single scanning exposure by using a projection system PS which has a demagnification in the x-direction of approximately 4×.

In alternative embodiments, the extent in the x-direction of the extended patterned area 21' may be greater than 104 mm. For example, in an embodiment the extent in the x-direction of the extended patterned area 21' may be approximately 130 mm. In this embodiment the full exposure field 31 shown in FIG. 7b may be exposed in a single scanning exposure by using a projection system PS which has a demagnification in the x-direction of approximately 5×. In other embodiments the extended patterned area 21' may have other extents in the x-direction which are greater than 104 mm. The demagnification in the x-direction which is used to expose such extended patterned areas 21' may be such that the extent in the x-direction of the resulting exposure field 31 on the substrate W is substantially equal to approximately 26 mm (i.e. the extent in the x-direction of a conventional full field).

A lithographic apparatus may be configured to support a 6 inch mask MA and may be configured to support an extended mask MA'. Thus the same lithographic apparatus may be used to expose both a conventional patterned area 21 and an extended patterned area 21'. The lithographic apparatus may comprise a support structure MT which is configured to support both a 6 inch mask MA and an extended mask MA (at different times to one another). Alternatively the lithographic apparatus may comprise interchangeable support structures MT comprising at least one support structure which is configured to support a 6 inch mask MA and at least one support structure MT which is configured to support an extended mask MA'. The support structures MT may be interchanged in the lithographic apparatus depending on the mask MA which is to be exposed.

A lithographic apparatus which is configured to support a 6 inch mask MA and which is configured to support an extended mask MA' may further comprise an anamorphic projection system PS. The anamorphic projection system PS may have a demagnification in the y-direction of approximately 8× and a demagnification in the x-direction of approximately 4×. Alternatively the anamorphic projection system PS may have a demagnification in the x-direction of greater than 4×. For example, the anamorphic projection system PS may have a demagnification in the x-direction greater than 4.5×, greater than 4.8×, a demagnification of 5× or more. The anamorphic projection system PS may have a demagnification in the y-direction of less than 8×. For example, the anamorphic projection system may have a demagnification in the y-direction of about 7.5× or a demagnification in the y-direction of about 6.3×. In general the anamorphic projection system PS may have a demagnification in the y-direction which is greater than 6×.

The same anamorphic projection system PS may be used during the exposure of both 6 inch masks MA and extended masks MA'. The extent of the resulting exposure region 31 on the substrate W will depend on the size of the mask MA which is exposed and in particular the size of the patterned area 21 on the mask MA.

A lithographic apparatus which is configured to support a 6 inch mask MA and which is configured to support an extended mask MA' may provide greater flexibility to a user of the lithographic apparatus. The increased demagnification of the lithographic apparatus in the y-direction may facilitate a decreased achievable critical dimension when compared to a conventional lithographic apparatus. The lithographic apparatus may be used to expose extended masks MA' for which there may be little or no reduction in the throughput of the lithographic apparatus. The lithographic apparatus may also be used to expose 6 inch masks MA and therefore provides compatibility with the considerable infrastructure which is set up to manufacture and use 6 inch masks.

It is usual in the manufacture of devices such as integrated circuits to provide a first functional layer of an integrated circuit or other device with a small critical dimension, and to provide subsequent layers of the device with larger critical dimensions. An EUV lithographic apparatus comprising an anamorphic projection system PS such as those described above may therefore be used to pattern a first functional layer on the substrate W with a small critical dimension. The substrate W may then be transferred to one or more other lithographic apparatus in order to pattern subsequent layers having larger critical dimensions. The one or more other lithographic apparatus may include conventional EUV lithographic apparatus (e.g. with a demagnification of 4× in both the x and y-directions) and may include lithographic apparatus which do not use EUV radiation (for example a DUV lithographic apparatus).

An anamorphic projection system of a lithographic apparatus is described in US20130128251. Embodiments of the invention may use a projection system which is modified from that projection system. Projection systems and lithographic apparatus comprising such a projection system have been referred to having reduction factors in x of 4×, 4.4×, 4.5×, 4.8×, 5×, 5.1×. Projection systems and lithographic apparatus comprising such a projection system have been referred to having reduction factors in y of 6.3×, 7.5×, 7.9× and 8×. It should be understood that these values of reduction factors are approximate values and that some adjustment of a projection system's demagnification may be possible during use (e.g. to accommodate tolerances in the lithographic apparatus).

In an embodiment, there is provided a lithographic apparatus comprising: a support structure constructed to support a mask comprising a patterned area which is capable of imparting a radiation beam with a pattern in its cross-section to form a patterned radiation beam, wherein the support structure is movable in a scanning direction; a substrate table constructed to hold a substrate, wherein the substrate table is movable in the scanning direction; and a projection system configured to project the patterned radiation beam onto an exposure region of the substrate, wherein the projection system has a demagnification in the scanning direction which is greater than a demagnification in a second direction which is perpendicular to the scanning direction and wherein the demagnification in the second direction is greater than 4×.

In an embodiment, the demagnification of the projection system in the scanning direction is greater than 6×. In an embodiment, the demagnification of the projection system in the second direction is 4.8×. In an embodiment, the demagnification of the projection system in the scanning direction is 7.5×. In an embodiment, the patterned area of the mask has an extent in the second direction which is greater than 104 mm. In an embodiment, the patterned area of the mask has an extent in the scanning direction which is less than or equal to 132 mm. In an embodiment, the patterned area of the mask has an extent in the scanning direction of 124 mm and an extent in the second direction of 124 mm.

In an embodiment, there is provided a method of exposing an exposure region on a substrate using a lithographic apparatus, the method comprising: scanning an exposure slit of radiation in a scanning direction and over a patterned area of a mask; and projecting an exposure slit of radiation which is reflected from the mask onto the exposure region of the substrate with a demagnification in the scanning direction which is greater than a demagnification in a second direction which is perpendicular to the scanning direction, wherein the demagnification in the second direction is greater than 4×.

In an embodiment, the demagnification in the second direction is 4.8×. In an embodiment, the demagnification in the scanning direction is 7.5×. In an embodiment, the patterned area of the mask has an extent in the second direction which is greater than 104 mm. In an embodiment, the patterned area of the mask has an extent in the scanning direction which is less than or equal to 132 mm. In an embodiment, the patterned area of the mask has an extent in the scanning direction of 124 mm and an extent in the second direction of 124 mm. In an embodiment, the patterned area of the mask is disposed on a quality area of the mask. In an embodiment, the quality area of the mask has an extent in the scanning direction of approximately 132 mm. In an embodiment, the quality area of the mask has an extent in the second direction of approximately 132 mm.

In an embodiment, there is provided a mask for use in a lithographic apparatus wherein the mask comprises a patterned area which is capable of imparting a radiation beam with a pattern in its cross-section to form a patterned radiation beam and wherein the mask is configured with a scanning direction in which the radiation beam is scanned over the patterned area in use, wherein the patterned area has an extent of greater than 104 mm in a second direction which is perpendicular to the scanning direction.

In an embodiment, the patterned area of the mask has an extent in the scanning direction of approximately 124 mm. In an embodiment, the patterned area of the mask has an extent in the second direction of approximately 124 mm. In an embodiment, the patterned area is disposed on a quality area of the mask. In an embodiment, the quality area of the mask has an extent in the scanning direction of approximately 132 mm. In an embodiment, the quality area of the mask has an extent in the second direction of approximately 132 mm. In an embodiment, the quality area of the mask has rounded corners. In an embodiment, the mask has an extent in the scanning direction of around 6 inches and an extent in the second direction of around 6 inches.

Although specific reference may be made in this text to embodiments of the invention in the context of a lithographic apparatus, embodiments of the invention may be used in other apparatus. Embodiments of the invention may form part of a mask inspection apparatus, a metrology apparatus, or any apparatus that measures or processes an object such as a wafer (or other substrate) or mask (or other patterning device). These apparatus may be generally referred to as lithographic tools. Such a lithographic tool may use vacuum conditions or ambient (non-vacuum) conditions.

The term "EUV radiation" may be considered to encompass electromagnetic radiation having a wavelength within the range of 4-20 nm, for example within the range of 13-14 nm. EUV radiation may have a wavelength of less than 10 nm, for example within the range of 4-10 nm such as 6.7 nm or 6.8 nm.

Although specific reference may be made in this text to the use of lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays, liquid-crystal displays (LCDs), thin-film magnetic heads, etc.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below.

The invention claimed is:

1. A lithographic apparatus comprising:
   a support structure constructed to support a mask comprising a patterned area which is capable of imparting a radiation beam with a pattern in its cross-section to form a patterned radiation beam, wherein the support structure is movable in a scanning direction;
   a substrate table constructed to hold a substrate, wherein the substrate table is movable in the scanning direction; and
   a projection system configured to project an exposure field of the patterned radiation beam onto an exposure region of the substrate,
   wherein the projection system has a demagnification in the scanning direction which is greater than a demagnification in a second direction which is perpendicular to the scanning direction,
   wherein the demagnification in the second direction is greater than 4×,
   wherein the demagnification in the scanning direction is less than 8×,
   wherein a difference between the demagnification in scanning direction and the demagnification in the second direction is greater than or equal to about 1.2×, wherein the patterned area of the mask has a crosswise dimension, in the scanning direction and spanning from a first part of an outer boundary of the patterned area to an opposite second part of the outer boundary, that is less than 132 mm, and wherein the exposure field has a crosswise dimension in a direction corresponding to the second direction of approximately 26 mm or more.

2. The lithographic apparatus of claim 1, wherein the demagnification of the projection system in the scanning direction is greater than 6×.

3. The lithographic apparatus of claim 1, wherein the demagnification of the projection system in the second direction is 4.8×.

4. The lithographic apparatus of claim 1, wherein the demagnification of the projection system in the scanning direction is 7.5×.

5. The lithographic apparatus of claim 1, wherein the patterned area of the mask has a crosswise dimension, in the second direction and spanning from a third part of the outer boundary to an opposite fourth part of the outer boundary, which is greater than 104 mm.

6. The lithographic apparatus of claim 1, wherein the patterned area of the mask has the crosswise dimension in the scanning direction of 124 mm and a crosswise dimension, in the second direction and spanning from a third part of the outer boundary to an opposite fourth part of the outer boundary, of 124 mm.

7. The lithographic apparatus of claim 1, wherein the patterned area of the mask is disposed on a quality area of the mask and the quality area of the mask has an extent in the scanning direction of approximately 132 mm.

8. The lithographic apparatus of claim 1, wherein the patterned area of the mask is disposed on a quality area of the mask and the quality area of the mask has an extent in the second direction of approximately 132 mm.

9. The lithographic apparatus of claim 1, further comprising an illumination system configured to provide an illumination beam and wherein the patterning device is reflective and wherein the support structure and/or the illumination system is arranged to provide the illumination beam incident on the patterning device with a non-zero chief ray angle.

10. A method of exposing an exposure region on a substrate using a lithographic apparatus, the method comprising:

scanning an exposure slit of radiation in a scanning direction and over a patterned area of a mask; and projecting an exposure field of radiation which is reflected from the mask onto the exposure region of the substrate with a demagnification in the scanning direction which is greater than a demagnification in a second direction which is perpendicular to the scanning direction, wherein the demagnification in the second direction is greater than 4×, wherein the demagnification in the scanning direction is less than 8×, wherein a difference between the demagnification in scanning direction and the demagnification in the second direction is greater than or equal to about 1.2×, wherein the patterned area of the mask has a crosswise dimension, in the scanning direction and spanning from a first part of an outer boundary of the patterned area to an opposite second part of the outer boundary, that is less than 132 mm, and wherein the exposure field has a crosswise dimension in a direction corresponding to the second direction of approximately 26 mm or more.

11. The method of claim 10, wherein the demagnification in the second direction is 4.8×.

12. The method of claim 10, wherein the demagnification in the scanning direction is 7.5×.

13. The method of claim 10, wherein the patterned area of the mask has a crosswise dimension, in the second direction and spanning from a third part of the outer boundary to an opposite fourth part of the outer boundary, which is greater than 104 mm.

14. The method of claim 10, wherein the patterned area of the mask has the crosswise dimension in the scanning direction of 124 mm and a crosswise dimension, in the second direction and spanning from a third part of the outer boundary to an opposite fourth part of the outer boundary, of 124 mm.

15. The method of claim 10, wherein the patterned area of the mask is disposed on a quality area of the mask.

16. The method of claim 15, wherein the quality area of the mask has an extent in the scanning direction of approximately 132 mm.

17. The method of claim 15, wherein the quality area of the mask has an extent in the second direction of approximately 132 mm.

18. A lithographic apparatus comprising:

a support structure constructed to support a mask comprising a patterned area which is capable of imparting a radiation beam with a pattern in its cross-section to form a patterned radiation beam, wherein the support structure is movable in a scanning direction;

a substrate table constructed to hold a substrate, wherein the substrate table is movable in the scanning direction; and a projection system configured to project an exposure field of the patterned radiation beam onto an exposure region of the substrate, wherein the projection system has a demagnification in the scanning direction which is greater than a demagnification in a second direction which is perpendicular to the scanning direction, wherein the demagnification in the second direction is greater than 4×, wherein the demagnification in the scanning direction is less than 8×, wherein a ratio of the demagnification in the scanning direction to the demagnification in the second direction is greater than or equal to 6.3:5.1, wherein the patterned area of the mask has a crosswise dimension, in the scanning direction and spanning from a first part of an outer boundary of the patterned area to an opposite second part of the outer boundary, that is less than 132 mm, and wherein the exposure field has a crosswise dimension in a direction corresponding to the second direction of approximately 26 mm or more.

19. The lithographic apparatus of claim 18, wherein the demagnification of the projection system in the scanning direction is greater than 6×.

20. The lithographic apparatus of claim 18, wherein the demagnification of the projection system in the second direction is greater than or equal to 4.5×.

21. The lithographic apparatus of claim 18, wherein the demagnification of the projection system in the scanning direction is greater than or equal to 7×.

22. The lithographic apparatus of claim 18, wherein the patterned area of the mask has a crosswise dimension, in the second direction and spanning from a third part of the outer boundary to an opposite fourth part of the outer boundary, which is greater than 104 mm.

23. The lithographic apparatus of claim 18, wherein the patterned area of the mask has the crosswise dimension in the scanning direction of 124 mm and a crosswise dimension, in the second direction and spanning from a third part of the outer boundary to an opposite fourth part of the outer boundary, of 124 mm.

24. The lithographic apparatus of claim 18, wherein the patterned area of the mask is disposed on a quality area of the mask and the quality area of the mask has an extent in the scanning direction of approximately 132 mm.

25. The lithographic apparatus of claim 18, wherein the patterned area of the mask is disposed on a quality area of the mask and the quality area of the mask has an extent in the second direction of approximately 132 mm.

26. The lithographic apparatus of claim 18, further comprising an illumination system configured to provide an illumination beam and wherein the patterning device is reflective and wherein the support structure and/or the illumination system is arranged to provide the illumination beam incident on the patterning device with a non-zero chief ray angle.

27. The lithographic apparatus of claim 18, wherein the demagnification in the second direction is 4.8×.

28. The lithographic apparatus of claim 18, wherein the demagnification in the scanning direction is 7.5×.

* * * * *